United States Patent
Yializis et al.

(10) Patent No.: US 7,807,232 B2
(45) Date of Patent: Oct. 5, 2010

(54) INLINE PASSIVATION OF VACUUM-DEPOSITED ALUMINUM ON WEB SUBSTRATE

(75) Inventors: Angelo Yializis, Tucson, AZ (US);
Michael Mikhael, Tucson, AZ (US)

(73) Assignee: Sigma Laboratories of Arizona, LLC, Tucson, AZ (US)

( * ) Notice: Subject to any disclaimer, the term of this patent is extended or adjusted under 35 U.S.C. 154(b) by 1015 days.

(21) Appl. No.: 11/586,478

(22) Filed: Oct. 25, 2006

(65) Prior Publication Data

US 2007/0166556 A1 Jul. 19, 2007

Related U.S. Application Data

(63) Continuation-in-part of application No. 11/335,039, filed on Jan. 18, 2006.

(51) Int. Cl.
*H05H 1/24* (2006.01)
(52) U.S. Cl. .......... 427/535; 427/250; 427/294
(58) Field of Classification Search .......... 427/250, 427/535, 294
See application file for complete search history.

(56) References Cited

U.S. PATENT DOCUMENTS

| | | | |
|---|---|---|---|
| 6,214,422 B1* | 4/2001 | Yializis | 427/488 |
| 6,447,612 B1* | 9/2002 | Moriyama et al. | 118/718 |
| 6,576,061 B1* | 6/2003 | Moriyama et al. | 118/719 |
| 2001/0041265 A1* | 11/2001 | Yializis | 428/500 |
| 2003/0194482 A1* | 10/2003 | Shimoda et al. | 427/8 |
| 2004/0197489 A1* | 10/2004 | Heuser et al. | 427/535 |

OTHER PUBLICATIONS

Comini, G., et al., "Thermal modeling of vacuum web coating". Applied Thermal Engineering 27 (2007) pp. 611-618.*
Ludwig, Rainer, et al., "Clear Barriers and High Volume Productivity"No date nor pages nor reference information provided.*

* cited by examiner

*Primary Examiner*—Bret Chen
(74) *Attorney, Agent, or Firm*—Antonio R. Durando

(57) ABSTRACT

In a continuous in-vacuum process for the manufacture of a film metallized with aluminum, the aluminum layer is exposed to a passivating agent, inline, immediately after deposition and prior to rewinding of the film onto a take-up roller. Passivation is carried out by plasma treatment in an oxidizing atmosphere (oxygen, nitrogen or others). The resulting product exhibits no peel-off problems during unwinding of the take-up roller and greatly improved corrosion resistance.

8 Claims, 2 Drawing Sheets

INLINE PASSIVATION OF VACUUM-DEPOSITED ALUMINUM ON WEB SUBSTRATE

RELATED APPLICATIONS

This is a continuation-in-part application of U.S. Ser. No. 11/335,039, filed Jan. 18, 2006.

BACKGROUND OF THE INVENTION

1. Field of the Invention

This invention is related in general to the production of aluminum-coated polymeric structures used as barrier films for packaging applications. In particular, the invention pertains to the inline passivation of aluminum layers vapor-deposited on polymer webs in vacuum.

2. Description of the Related Art

Metallized films produced in high volume for applications such as decorative, food, agricultural, biomedical and electronic packaging are usually evaluated for their appearance, conductivity, adhesion to the polymer substrate, and for their gas and vapor barrier properties. It is well known that all of these properties, as well as resistance to corrosion, depend on the substrate and the metallization conditions. The web metallizing industry has adopted inline high-speed plasma treatment of the substrate to improve the quality of metal deposition, such as to produce better aluminum metal nucleation, adhesion and barrier properties, but little or no attention has been paid to corrosion resistance other than with regard to the effects of the conditions of the metallization process (such as pressure, deposition rate, and aluminum wire purity).

In the normal process of manufacture of aluminum/polymer structures, the aluminum is deposited in vacuum over a pre-treated polymer web that is spooled in the vacuum chamber between a feed roller and a take-up roller. The aluminum is never exposed to oxidizing elements until it is removed from the vacuum chamber, normally in a humid environment. Such metallized webs (such as PET, PP and PE) are exposed to air during post-production slitting and other converting processes, and this has been assumed adequate to passivate the aluminum layer for long-term corrosion resistance. However, when the aluminum/polymer structure is unwound from the take-up production spool for post-production processing, it has been found that the aluminum film is often strongly bonded to the backside of the polymeric film and tends to peel off and damage the barrier properties of the metallized film, phenomena that are usually referred to in the art as "blocking" and "peel off," respectively.

We discovered that these problems are due to the early formation of hydrated aluminum oxide, $Al_2O_3 \cdot (H_2O)_n$, resulting from the reaction of the aluminum layer with air and moisture adsorbed and absorbed in the web during deposition and prior to rewinding of the coated web into the take-up roll. Some web materials (like PET) have a high moisture content (higher than olefinic films, for example) that further accelerates the oxidation process in the wound roll. Therefore, even if the aluminum/polymer structure is unwound in a low humidity environment to minimize the formation of hydrated aluminum oxide, a considerable amount will already have been formed immediately after metallization inside the film roll.

Furthermore, because aluminum is highly reactive in its metallic state, it may also react with organic functional groups on the surface of the polymer film to form organometallic compounds which, under the pressure present between the layers of the roll, cause the aluminum to adhere to the backside of the film. Thus, when the film is unwound from the roll, aluminum that is strongly bonded to the backside of the film will peel off.

This invention is directed at providing a solution to these problems by perfecting the manufacturing process of metallized structures. In particular, the invention describes an inline passivation process that has been found to essentially solve the peel-off and corrosion problems described above.

BRIEF SUMMARY OF THE INVENTION

In view of the foregoing, this invention is directed at the development of a general approach to passivate vapor-deposited aluminum layers in the vacuum chamber before they are exposed to any source of moisture, including by contact with the polymer web during winding in the vacuum chamber. The approach is based on the idea of exposing the aluminum layer to a passivating agent, inline during manufacture, under conditions that promote uniform passivation without undesirable secondary effects. The heart of the invention lies in using a plasma treatment in an oxidizing atmosphere (oxygen, nitrogen or others) to passivate the aluminum layer immediately after deposition and prior to rewinding the coated web into a roll.

The term "passivation" and related terminology are used in the art and herein to refer to the process of treating a metallic material to alter its susceptibility to deterioration from exposure to environmental factors, especially moisture. It is understood in the art that, in order to produce a corrosion-stable aluminum coating, it is necessary to create an $Al_2O_3$ or an AlN protective layer on the aluminum surface. Therefore, the term "passivating" agent or component is intended to include any molecule that, in a plasma field, is capable of producing $Al_2O_3$ or AlN in metallic aluminum exposed to it. Similarly, the term "oxidizing," in relation to metallic aluminum, is intended to refer to the formation of either $Al_2O_3$ or AlN.

According to the invention, the passivation step is performed in line immediately after deposition of the aluminum layer onto the web substrate. Oxygen or preferably a plasma gas containing an oxygen-bearing component (such as molecular oxygen or a molecule containing oxygen, e.g. $CO_2$, $N_2O$, etc.) in addition to conventional plasma gases (such as nitrogen, argon and helium) is introduced into the vacuum chamber under conditions designed to promote the formation of activated oxygen, which favors rapid oxidation. "Activated oxygen" is understood in the art to refer to oxygen in ionized or free radical form. Oxygen-bearing molecules such as $N_2O$ or $CO_2$, when added to a conventional inert plasma gas, produce activated oxygen in the plasma gas with a negligible amount of molecular oxygen, which has been found to produce the desired long-term anticorrosion effect on the metallic layer, and without the formation of ozone, which is undesirable.

Various other purposes and advantages of the invention will become clear from its description in the specification that follows and from the novel features particularly pointed out in the appended claims. Therefore, the invention consists of the features hereinafter illustrated in the drawings, fully described in the detailed description of the preferred embodiments and particularly pointed out in the claims.

DESCRIPTION OF THE PREFERRED EMBODIMENTS OF THE INVENTION

The invention is based on the recognition that inline passivation of the metal layer is a necessary step in the in-vacuum process of manufacture of metal/polymer films in order to avoid peel-off and corrosion problems. The invention lies in the fact that oxygen or, preferably, a plasma gas containing an oxygen-bearing molecule yields adequate inline passivation of the metallic layer produced by vapor deposition over a web running between spools in a vacuum chamber. Thus, the invention is described with reference to conventional inline vacuum deposition processes.

For the purposes of this disclosure, the terms "oxygen-bearing" molecules and gases are intended to refer not only to molecular oxygen but also to molecules and gases that contain oxygen (for example, $CO_2$, $N_2O$, etc.).

Figure 1:
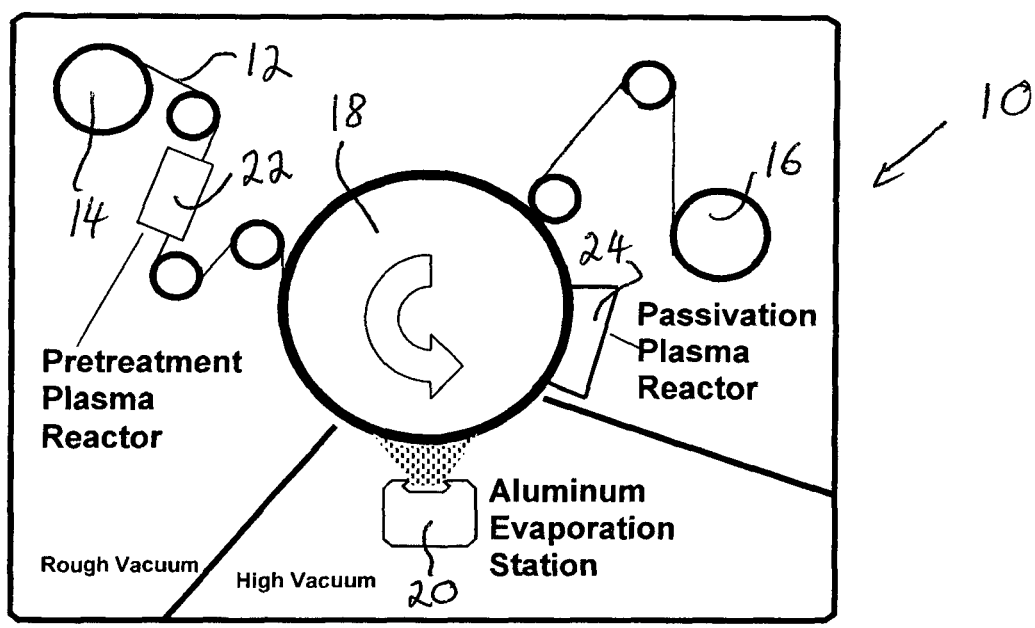
FIG. 1 is a schematic representation of a modified vacuum chamber according to the invention, including a plasma treater with a plasma-gas source past the metal-evaporation stage of a conventional process in order to passivate the top side of the metal layer deposited over a web running from a feed roller to a take-up roller in the vacuum chamber.

In the preferred embodiment, the invention is practiced in line during the course of manufacture of a metallized film wherein a metallic layer is deposited continuously over a web in a vacuum chamber 10, as illustrated in FIG. 1. A polymeric web 12, such as a polyester (most commonly PET, polyethylene terphalate), polypropylene (PP) or polyethylene (PE) film, is spooled between a feed roller 14 and a take-up roller 16 over a cold rotating drum 18. A metal-evaporation unit 20 is used to evaporate and deposit a metallic layer over the web 12. The speed of the rotating drum 18 is controlled to produce the desired layer thickness. A conventional pre-treatment plasma unit 22 is preferably used prior to the metallization step to clean the web surface and promote adherence of the metal layer to the web 12.

The present invention is based on the utilization of an additional plasma unit 24 operated with a gas containing an oxygen-bearing component to passivate the metal layer. It was found that a controlled amount of oxygen or, preferably, a plasma gas containing an oxygen-bearing constituent with conventional plasma gases will produce inline oxidation of the metallic layer as necessary to prevent the subsequent formation of hydrated aluminum oxides. The effect of the treatment is reflected not only in the immediate prevention of peel-off and blocking, but also in the subsequent long-term resistance to deterioration produced by moisture and other environmental factors.

Accordingly, the plasma unit 24 (which consists of a low-voltage plasma treater and a source of oxygen-bearing gas mixed with conventional plasma gases such as argon, helium or nitrogen) is added to the process stream in the vacuum chamber 10. The plasma treater is positioned past the metal-vaporization unit 20 to treat the metallic layer deposited over the underlying polymer web 12. As described, the oxygen-bearing gases in the plasma gas result in the passivation of the metal layer in a continuous inline sequence of operation. While not preferred, it was found that the use of oxygen alone would also provide a significant degree of passivation.

Figure 2:
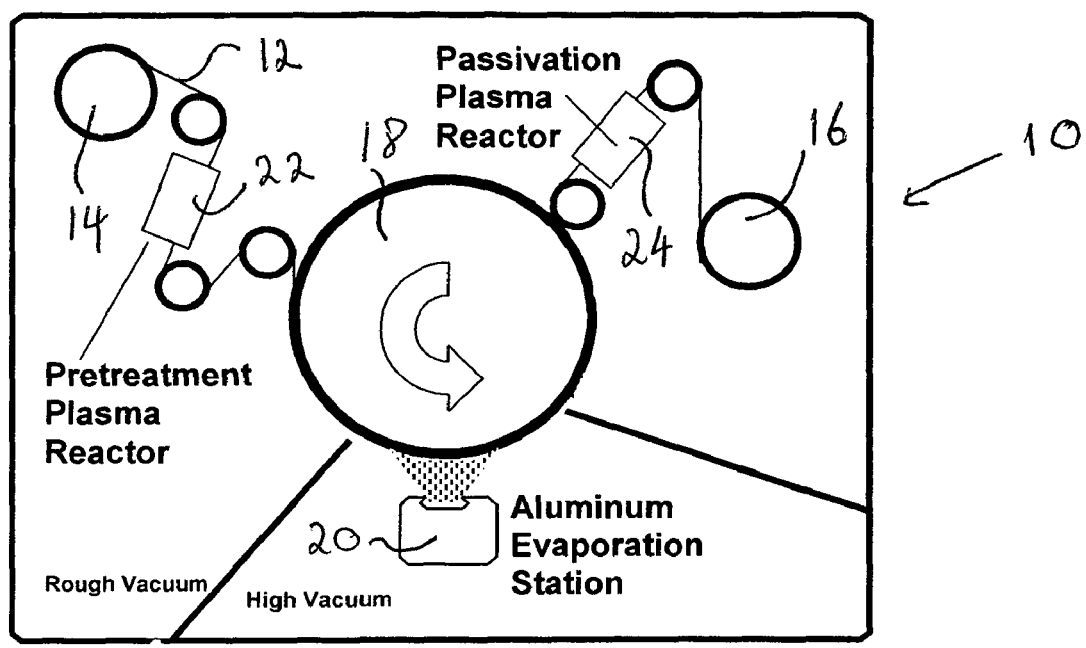
FIG. 2 is a schematic representation of the same vacuum chamber of FIG. 1 wherein the plasma treater of the invention is placed in a separate, higher-pressure zone of the chamber.

In an alternative embodiment of the invention illustrated in FIG. 2, the plasma treater 24 is positioned further downstream in the vacuum chamber, after the coated web is separated from the cold drum 18. In all cases, though, the passivation treatment must be carried out prior to rewinding the coated web on the take-up spool 16. In order to passivate the aluminum as soon as possible after deposition, the configuration of FIG. 1 is preferred.

Various examples outlined below show the effectiveness of inline plasma treatment for eliminating peel off and improving the corrosion resistance of metallized films. All percentages listed in the examples are based on volume.

EXAMPLE 1

The effect of inline oxygen-plasma treatment on take-up roll peel off and subsequent product resistance to corrosion was tested in various runs by metallizing a PET film in a conventional roll-to-roll vacuum metallization chamber. Using the equipment shown in FIG. 1, aluminum was deposited in each run as a layer of different thickness corresponding to an optical density greater than 1 (greater than 2.5 for barrier applications). After deposition, the surface of the aluminum film was exposed to a plasma gas containing an oxygen-bearing molecule in the vacuum chamber under different conditions, as shown in Table 1.

The plasma was generated by a mid-frequency voltage (50-300 KHz). After the roll of film was removed from the vacuum chamber, it was unwound in air and any peel off was noted and recorded; the unwound film was then subjected to a moisture resistance test. The metallized samples were placed in a humidity chamber operating at 40° C. and 90% relative humidity for 65 hours. The samples then were placed on a light table and the corrosion condition of the aluminum layer was determined by visual inspection as a percentage of the light transmitted through the uncorroded aluminum. The results in Table 1 show that untreated samples exhibited peel-off problems and total corrosion, while the plasma treated samples showed great improvement.

TABLE 1

| Treatment Condition | Corrosion Condition After 65 hrs at 40 C./90% RH (Visual Observation) |
| --- | --- |
| No plasma* Several samples from different metallization runs | Average corrosion condition after tests = 0 |
| Plasma-treated samples with 50 sccm of $O_2$/Ar (20%/80%) in the plasma reactor | Average corrosion condition after tests = 5 |
| Plasma-treated samples with 50 sccm of $O_2$/AR (50%/50%) in the plasma reactor | Average corrosion condition after tests = 8 |
| Plasma-treated samples with 50 sccm of $O_2$ only (100%) in the plasma reactor | Average corrosion condition after tests = 10 |

10 = No detectable corrosion
0 = full corrosion - no aluminum remained on the substrate
*Peel off was audible during unwinding in air, suggesting some degree of blocking due to aluminum reaction with the backside of the film

EXAMPLE 2

In order to produce more quantitative results, PET film was metallized, as shown in FIG. 1, and the aluminum metal was plasma treated after deposition, again with different gases, as indicated in Table 2. The degree of passivation was tested by dipping the treated film in deionized (DI) water for 90 seconds at 92° C., so as to corrode the aluminum metal by oxidation. The surface resistance of the film was then measured and compared to the resistance prior to the test as an indication of the degree of corrosion produced by the DI water (the $Al_2O_3$ produced by passivation being more resistant to corrosion than metallic aluminum and thus protecting against increased resistivity). The results show that higher oxygen contents during the treatment produced greater degrees of passivation in the aluminum layer.

TABLE 2

| Treatment Condition | Initial Surface Resistance of Aluminum Layer | Resistance of Aluminum Layer After Dipping in DI water at 92 C. for 90 sec. |
| --- | --- | --- |
| Nitrogen Plasma (100% $N_2$) - 50 sccm | 9.0 ohm | 70.0 ohm |
| Oxygen Plasma (100% $O_2$) - 50 sccm | 9.7 ohm | 10.5 ohm |
| Dry Air Plasma (100% air) - 50 sccm | 8.0 ohm | 13.5 ohm |
| Metallization with No Plasma | 8.0 ohm | Non Conductive (fully corroded) |

EXAMPLE 3

A web made of biaxially oriented polypropylene (BOPP) was first plasma treated to improve the surface quality for bonding, the aluminum was deposited and then passivated using a plasma reactor operating at 50 KHz. The take-up rolls were unwound (no peel off was noted) and samples were tested via accelerated corrosion testing, as indicated in Table 3, and compared to a control film that had not been passivated by inline plasma treatment. These tests show the effectiveness of passivating aluminum metal by inline plasma treatment after deposition

TABLE 3

| Sample | Plasma Post Treatment | 24 hr at 90 C./85% RH | 96 hr 90 C./85% RH | 120 hr 90 C./ 85% RH |
| --- | --- | --- | --- | --- |
| Metallized BOPP | None | 10 | 6 | 4 |
| Metallizied BOPP | 100% Oxygen Treatment | 10 | 9 | 9 |

10 = No detectable corrosion
0 = Full corrosion - no aluminum detectable on the substrate

EXAMPLE 4

In another example, an aluminum-coated polyethylene film that had not been passivated during manufacture was plasma treated afterwards using a plasma gas with 20% oxygen and 2 KW/40 KHz plasma power, at a web speed of 300 ft/min. The aluminum corrosion resistance was then tested against a control consisting of a similar film passivated in line during production. An accelerated corrosion test was used for comparison, where the metallized films were placed over boiling water for a period sufficient to establish significant corrosion, as indicated in Table 4.

TABLE 4

| Sample | Period Required to Detect Significant Corrosion by Exposure to Boiling Water |
| --- | --- |
| Test Metallized Film | 30 seconds |
| Control Metallized Film | 150 seconds |

This test shows that it is important to passivate aluminum deposited in vacuum to form a protective and passivating oxide before it is exposed to any moisture. It should also be noted that, in situations where the speed of the web in the vacuum chamber is sufficiently slow, exposure of the highly reactive aluminum to oxygen or dry air (without plasma) after the metallization process can by itself improve corrosion resistance.

In summary, the above examples show that blocking and attendant peel-off problems in metallized film rolls, as well as corrosion of the metallized film, can be reduced by passivating the aluminum layer inline before it is exposed to any moisture. This can be done using a plasma treatment or by exposure to a dry oxygen gas. Given the high speed process conditions that are used for most metallizing operations, an oxygen plasma is more practical and the plasma is a necessity in the case of a gas like nitrogen that reacts very slowly with aluminum.

The invention claimed is:

1. In a process for the manufacture of a metallized film, wherein an aluminum layer is vapor deposited continuously in a vacuum chamber over a web to produce a coated film that is spooled onto a take-up roller, a method of passivation to prevent corrosion and peel-off damage when the roller is unwound for post-production processing, wherein the improvement comprises the step of:

exposing the aluminum layer to a plasma field produced with a plasma gas containing a passivating component, said exposing step being carried out inline in the vacuum chamber immediately after the aluminum layer is vapor deposited and prior to spooling said coated web onto the take-up roller.

2. The process of claim 1, wherein said passivating component includes an oxygen-bearing molecule.

3. The process of claim 1, wherein said passivating component includes oxygen.

4. The process of claim 1, wherein said passivating component includes nitrogen.

5. The process of claim 1, further including the step of pre-treating the web in a plasma field prior to depositing said aluminum layer.

6. The process of claim 5, wherein said passivating component includes an oxygen-bearing molecule.

7. The process of claim 5, wherein said passivating component includes oxygen.

8. The process of claim 5, wherein said passivating component includes nitrogen.

* * * * *